(12) United States Patent
Shiobara et al.

(10) Patent No.: US 7,851,139 B2
(45) Date of Patent: Dec. 14, 2010

(54) PATTERN FORMING METHOD

(75) Inventors: Eishi Shiobara, Yokohama (JP); Takehiro Kondoh, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/257,221

(22) Filed: Oct. 23, 2008

(65) Prior Publication Data

US 2009/0117498 A1 May 7, 2009

(30) Foreign Application Priority Data

Oct. 24, 2007  (JP) ............................... 2007-276070

(51) Int. Cl.
*G03F 7/40* (2006.01)
(52) U.S. Cl. ...................... 430/325; 430/329; 430/330; 430/322
(58) Field of Classification Search ....................... None
See application file for complete search history.

(56) References Cited

U.S. PATENT DOCUMENTS 6,197,473 B1 * 3/2001 Kihara et al. ................ 430/192
7,147,985 B2 * 12/2006 Yueh et al. ................ 430/270.1
2005/0130068 A1   6/2005 Kondoh et al.
2008/0044759 A1 * 2/2008 Ishibashi et al. ......... 430/270.1
2008/0138746 A1   6/2008 Kondoh et al.

FOREIGN PATENT DOCUMENTS

JP          10-073927           3/1998

\* cited by examiner

*Primary Examiner*—Daborah Chacko Davis
(74) *Attorney, Agent, or Firm*—Finnegan, Henderson, Farabow, Garrett & Dunner, L.L.P.

(57) ABSTRACT

A pattern forming method according to an embodiment of the present invention includes forming a resist layer on a semiconductor substrate, selectively exposing the resist layer, developing the selectively exposed resist layer, decomposing photosensitizer in the resist layer after developing the resist layer, removing the photosensitizer or acid generated from the decomposed photosensitizer, applying a shrink material on the developed resist layer after removing the photosensitizer or the acid generated from the decomposed photosensitizer, performing a heating process for the resist layer on which the shrink material is applied, and removing a part of the heat-processed shrink material.

17 Claims, 6 Drawing Sheets

PATTERN FORMING METHOD

CROSS REFERENCE TO RELATED APPLICATION

This application is based upon and claims the benefit of priority from the prior Japanese Patent Application No. 2007-276070, filed on Oct. 24, 2007, the entire contents of which are incorporated herein by reference.

BACKGROUND OF THE INVENTION

1. Field of the Invention

The present invention relates to a pattern forming method, for example, to a pattern forming method which is performed in a lithography process for manufacturing a semiconductor device.

2. Background Art

A pattern forming method using a water-soluble resist pattern shrink material of an acid cross linking type has had a problem that, in a peeling step for removing the shrink material, photosensitizers acting as photo acid generators in a resist layer are deposited on a resist pattern after a spin-dry step to cause defects.

In general, the surface of the resist pattern after a shrink process is hydrophobic. On the hydrophobic surface, a watermark is easily generated, which causes defects.

A method for suppressing defects by using, for example, an activator as a special rinse liquid to the shrink material can be considered. However, in this case, it is necessary to provide a dedicated line for supplying the special rinse liquid, which increases a cost. Further, a rinsing process takes long time, which lowers a throughput. Therefore, a method for reducing defects without using the special rinse liquid has been desired.

An example of a conventional pattern forming method is disclosed in JP-A H10-73927 (KOKAI).

SUMMARY OF THE INVENTION

An aspect of the present invention is, for example, a pattern forming method including forming a resist layer on a semiconductor substrate, selectively exposing the resist layer, developing the selectively exposed resist layer, decomposing photosensitizer in the resist layer after developing the resist layer, removing the photosensitizer or acid generated from the decomposed photosensitizer, applying a shrink material on the developed resist layer after removing the photosensitizer or the acid generated from the decomposed photosensitizer, performing a heating process for the resist layer on which the shrink material is applied, and removing a part of the heat-processed shrink material.

DESCRIPTION OF THE EMBODIMENTS

Embodiments of the present invention will be described with reference to the drawings.

First Embodiment

Figure 1:
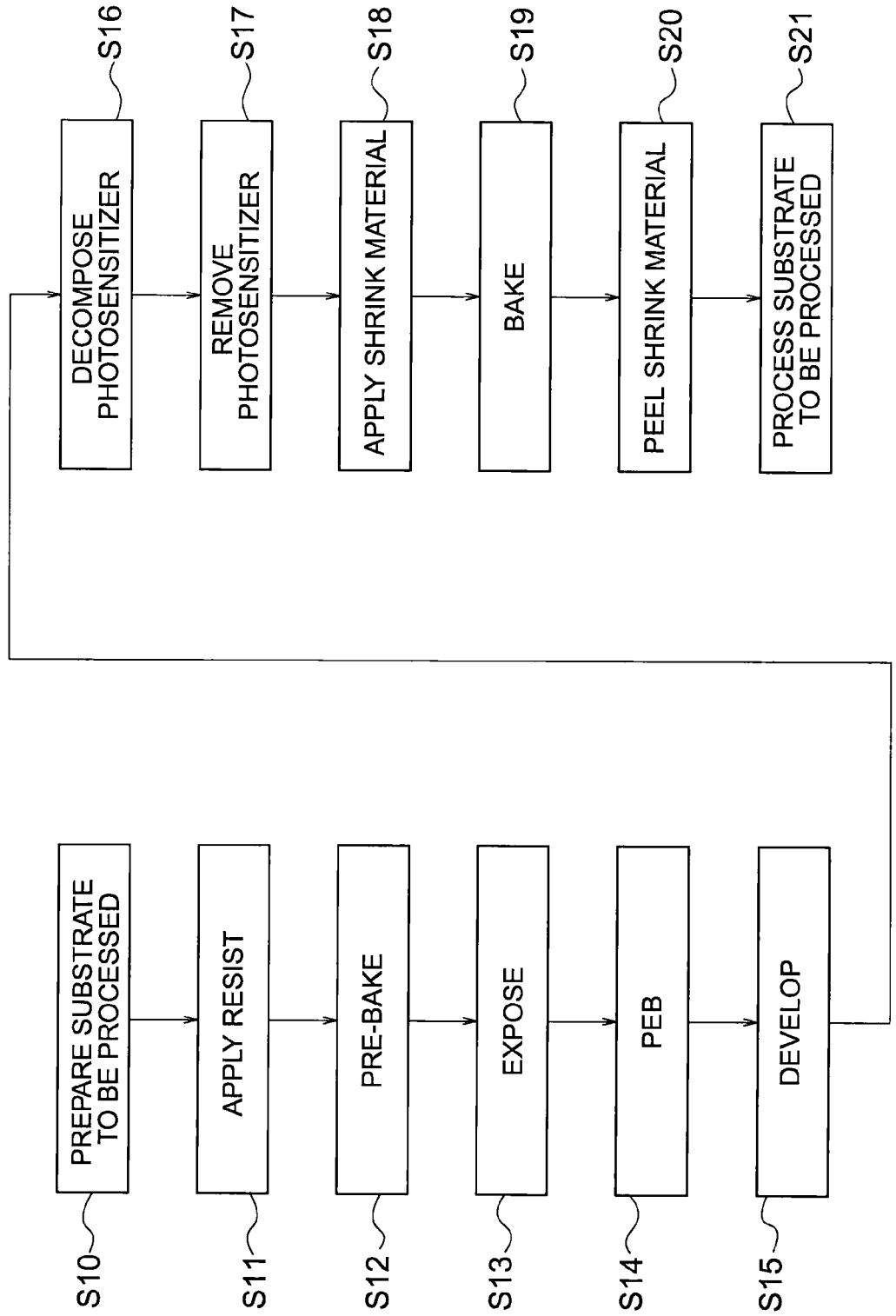
FIG. 1 is a flowchart showing a procedure of processes in a pattern forming method according to a first embodiment.
Figure 2:
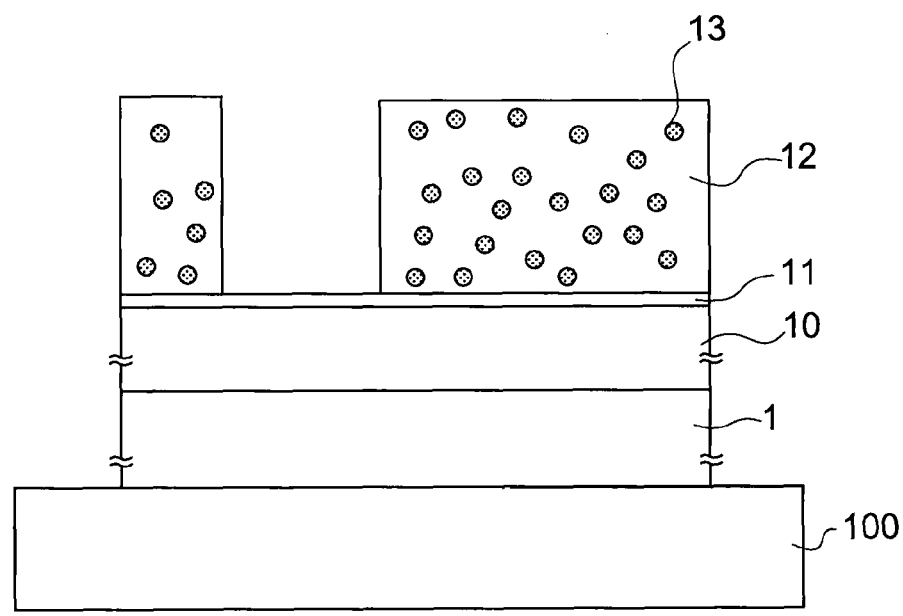
FIG. 2 is a side sectional view showing a cross section of a device in a step of the pattern forming method according to the first embodiment.
Figure 3:
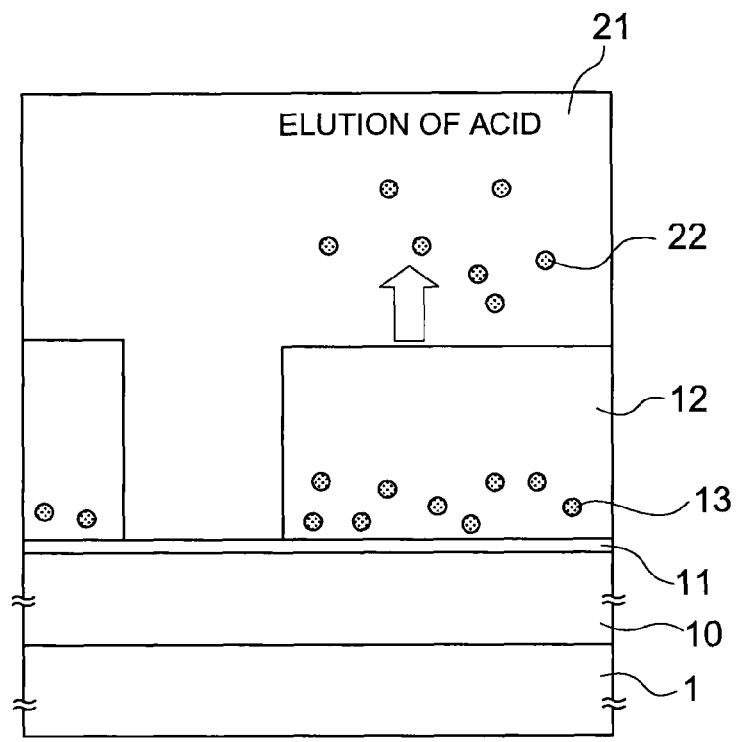
FIG. 3 is a side sectional view showing the cross section of the device in another step of the pattern forming method according to the first embodiment.

FIG. 1 shows a procedure of processes in a pattern forming method according to a first embodiment. FIGS. 2 and 3 show side sectional views in respective steps of the pattern forming method.

In step S10, a substrate to be processed is prepared. As shown in FIG. 2, the substrate is obtained by forming a silicon oxide layer 10 having a thickness of 1000 nm, which is a layer to be processed, on a semiconductor substrate 1. The oxide layer 10 in this embodiment is an inter layer dielectric. As an application type antireflection layer, for example, a layer of AR 19-820 (made by Rohm & Haas Co.) with a thickness of 82 nm is deposited on the silicon oxide layer 10 for forming an antireflection layer 11.

In step S11, a chemically amplified resist having a thickness of 200 nm is applied on the antireflection layer 11 for forming a resist layer 12. The resist layer 12 contains photosensitizer, which is not yet thermally decomposed and does not yet generate acid at this step.

In step S12, a pre-bake is performed by heating for 60 seconds at 120° C. on a hot plate 100.

In step S13, an exposing process is performed to the resist layer 12. For example, in order to obtain a contact hall pattern having a diameter of 120 nm, an exposure is performed with an exposure amount of 50 mJ/cm$^2$ through a halftone mask having a transmittance of 6% by using an ArF excimer laser exposing apparatus NSRS308B (made by Nikon Inc.) under illuminating conditions that a numeral aperture "NA" of a projection lens is 0.85 and a coherence factor "σ" is 0.3.

In step S14, a post-bake process is performed to the resist layer 12. For example, a heating process (Post Exposure Bake: hereinafter PEB) is performed for 60 seconds at 120° C. on the hot plate 100.

In step S15, a developing process is performed to the resist layer 12. For example, the semiconductor substrate 1 is immersed in a 2.38 wt % TMAH developing solution adjusted to 23° C. for 60 seconds.

In step S16, a decomposing process of the photosensitizer is performed. The semiconductor substrate 1 on which a pattern is formed is heated on the hot plate 100 for 60 seconds at 150° C. which is a temperature equal to or higher than the thermal decomposition temperature of the photosensitizer. Thereby, the photosensitizer is thermally decomposed to generate acid 13 as shown in FIG. 2. Incidentally, another semiconductor substrate 1 having a resist layer to which a pattern exposure was not performed was prepared and immersed in the developing solution, so that the resist was dissolved. Thereby, a phenomenon that the photosensitizer decomposes at 150° C. was confirmed.

Simultaneously, protecting groups in the resist layer 12 are decomposed, cross-linking sites in the resist layer 12 increase, and the surface of the resist layer 12 becomes hydrophilic in step S16. The surface of the resist layer 12 becomes hydrophilic by the exposing process in step S13 and the heating in step S16.

Then, a pure water paddle is formed for 30 seconds on the semiconductor substrate 1 in a developing unit of an applying/developing apparatus. Then, rinsing is also performed using pure water for 20 seconds, and drying is performed by a spin-dry method.

In step S17, as shown in FIG. 3, the semiconductor substrate 1 is immersed in an acid extracting solution 21 such as pure water, so that acid 22 or the photosensitizer is eluted in the acid extracting solution 21. The acid extracting solution 21 is a solution for extracting acid.

Further, the acid 22 or the photosensitizer is removed from the resist layer 12 by rinsing the resist layer 12 with water. On the hydrophilic surface of the resist layer 12, occurrences of watermarks are suppressed, which reduces occurrences of defects.

Figure 4:
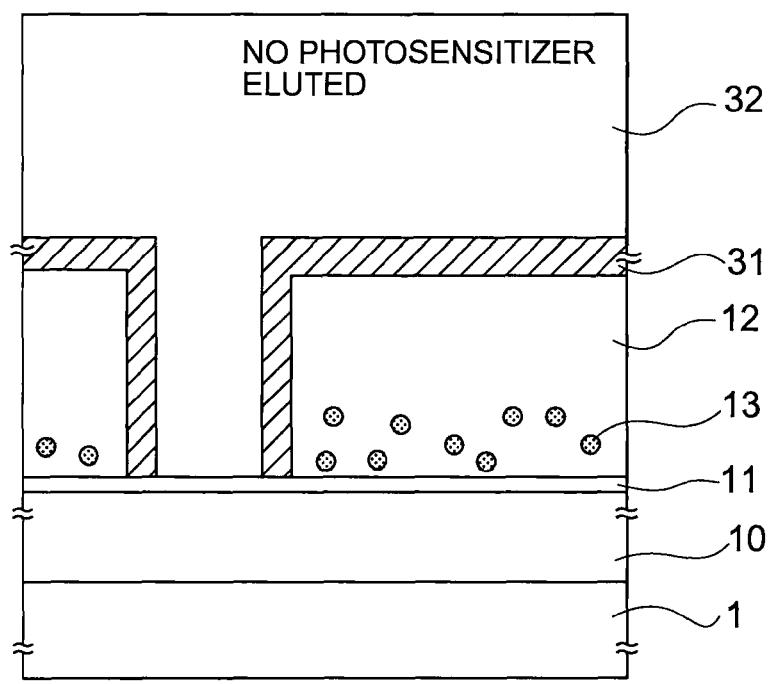
FIG. 4 is a side sectional view showing the cross section of the device in another step of the pattern forming method according to the first embodiment.

In step S18, as shown in FIG. 4, a water-soluble shrink material 31 of an acid cross linking type with a thickness of 300 nm is applied for decreasing the size of the contact hole.

In step S19, a heating process is performed for 60 seconds at 130° C. on the hot plate 100, and a mixing bake for mixing the resist layer 12 and the shrink material 31 is performed. Thereby, a cross linking reaction occurs between the surface of the resist layer 12 and the shrink material 31. As the heating temperature becomes higher, the amount of shrink increases, which enables further decreasing the size of the contact hole. However, the number of defects tends to increase.

Figure 5:
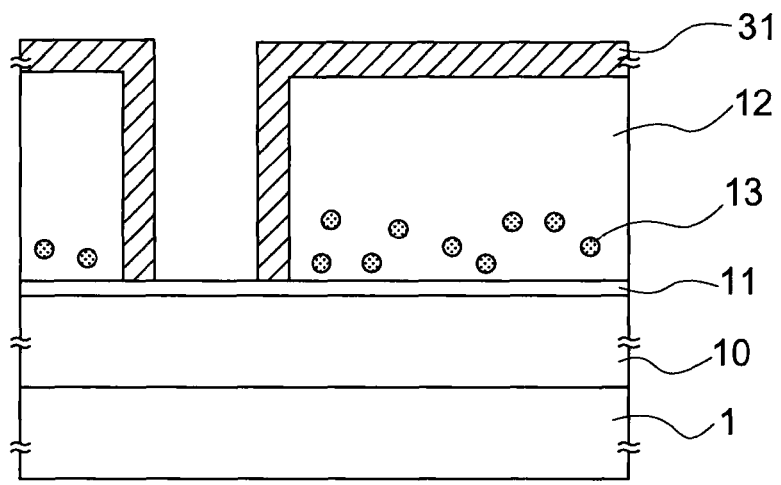
FIG. 5 is a side sectional view showing the cross section of the device in another step of the pattern forming method according to the first embodiment.

In step S20, as shown in FIG. 4, a peeling process of peeling unnecessary shrink material 31 is performed by using pure water as a peeling solution 32 for the shrink material 31. Specifically, for example, a pure water paddle is formed for 30 seconds on the semiconductor substrate 1 in the developing unit of the applying/developing apparatus. Then, rinsing is also performed using pure water for 20 seconds, so that the unnecessary unreacted shrink material 31 is removed as shown in FIG. 5. Then, drying is performed by the spin-dry method. As shown in FIG. 4, a flowing out of the acid 13 or the like from the resist layer 12 is prevented after applying the shrink material 31, so that the occurrences of the defects are suppressed.

In general, the surface of the resist layer 12 after a shrink process is hydrophobic. On the hydrophobic surface, a watermark is easily generated, and defects due to the shrink process easily occur. However, according to the pattern forming method of the first embodiment, the acid 13 or the like in the resist layer 12, which causes defects, is removed and dried on the more hydrophilic surface. Therefore, the occurrences of the defects are largely suppressed.

When the hole diameter of the contact hole was measured by an electron microscope having a length measuring function after the above process, it was shown that the size of the hole diameter was decreased by 10 nm.

Further, when a defect inspection of the semiconductor substrate 1 was performed, no defect due to aggregation of the acid or the photosensitizer was observed.

Then, the semiconductor substrate 1 is processed in step S21. In step S21, the silicon oxide layer 10 as an inter layer dielectric on the semiconductor substrate 1 is processed by a dry etching apparatus using a phlorocarbon type gas. When the substrate was observed after an ashing of the resist layer, it was observed that the contact hole having a suitable shape was formed.

As described above, according to the first embodiment, following actions and advantages can be obtained.

1) The photosensitizer is thermally decomposed after developing the resist layer, so that the acid is generated. In this step, the acid or the like is difficult to aggregate because the surface of the resist layer is hydrophilic.

2) The acid generated on the surface is removed by a rinsing process. The rinsing process is performed before the surface of the resist layer is covered with the applied shrink material and becomes hydrophobic, which prevents the aggregation of the acid on the surface. Then, when the surface of the resist layer becomes hydrophobic by being covered with the applied shrink material, the photosensitizer flowing out of the resist layer is largely reduced, so that the aggregation does not occur on the surface of the shrink material.

3) Since the photosensitizer can be removed by pure water without using a special rinse liquid or the like, it is not required to provide a supply line for the special rinse liquid, which can contribute to a cost reduction.

According to the first embodiment, when the pattern forming method is performed using a chemically amplified resist, an effect of largely reducing the occurrences of the defects can be obtained.

Second Embodiment

A pattern forming method according to a second embodiment will be described. A procedure of processes in the pattern forming method of the second embodiment is similar to that of the first embodiment shown in FIG. 1. However, in the first embodiment, the decomposing process of the photosensitizer in step S16 is performed by heating the resist layer 12 by the hot plate 100.

Figure 6:
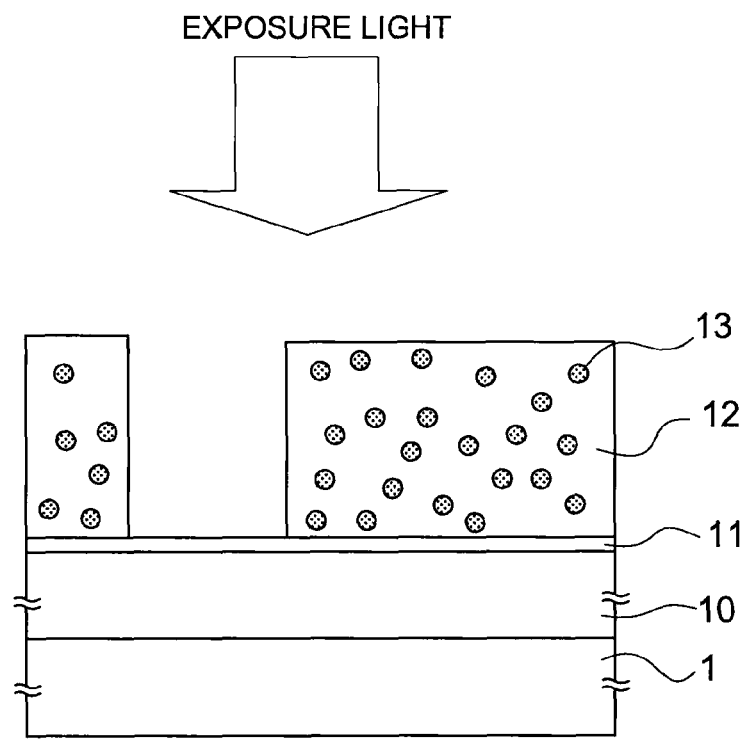
FIG. 6 is a side sectional view showing a cross section of a device in a step of a pattern forming method according to a second embodiment.

On the other hand, in the second embodiment, an exposing apparatus irradiates the surface of the resist layer 12 with an exposure light, for example, with an exposure amount of 30 mJ/cm$^2$ as shown in FIG. 6. The exposure light is an example of an energy ray. Then, the semiconductor substrate 1 is placed on a hot plate to perform a heating process for 60 seconds at 120° C. The surface of the resist layer 12 becomes hydrophilic by the exposing process in step S13 and the heating process in step S16.

Figure 7:
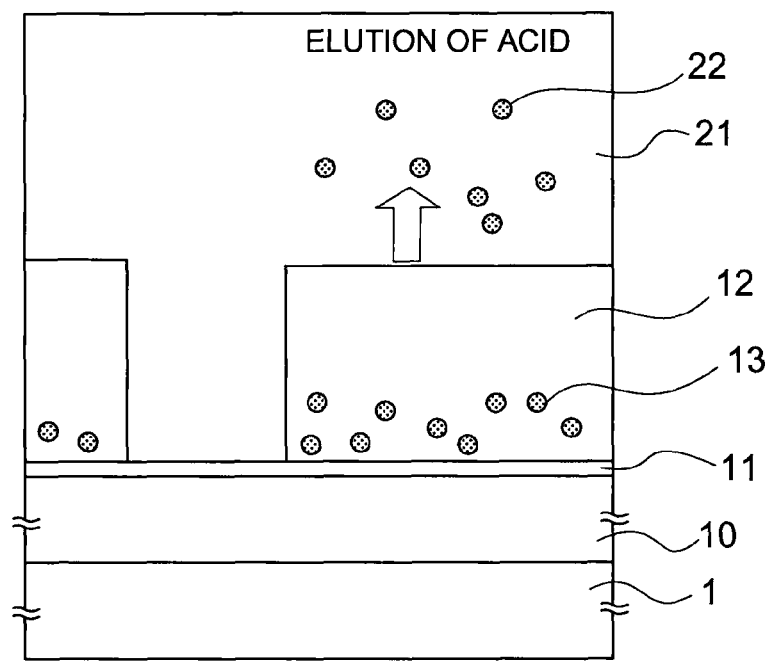
FIG. 7 is a side sectional view showing the cross section of the device in another step of the pattern forming method according to the second embodiment.

Then, in step S17, as shown in FIG. 7, the semiconductor substrate 1 is immersed in an acid extracting solution 21 to remove acid 13 in the resist layer 12. Thereby, acid 22 is eluted in the acid extracting solution 21.

Further, the resist layer 12 is rinsed with water to remove the eluted acid 22. On the hydrophilic surface of the resist layer 12, occurrences of watermarks are suppressed, which reduces occurrences of defects.

Similarly to the first embodiment, according to the second embodiment, the photosensitizer in the resist layer, which causes defects, is previously removed before the shrink step, so that the occurrences of the defects can be prevented.

Comparative Example

Figure 8:
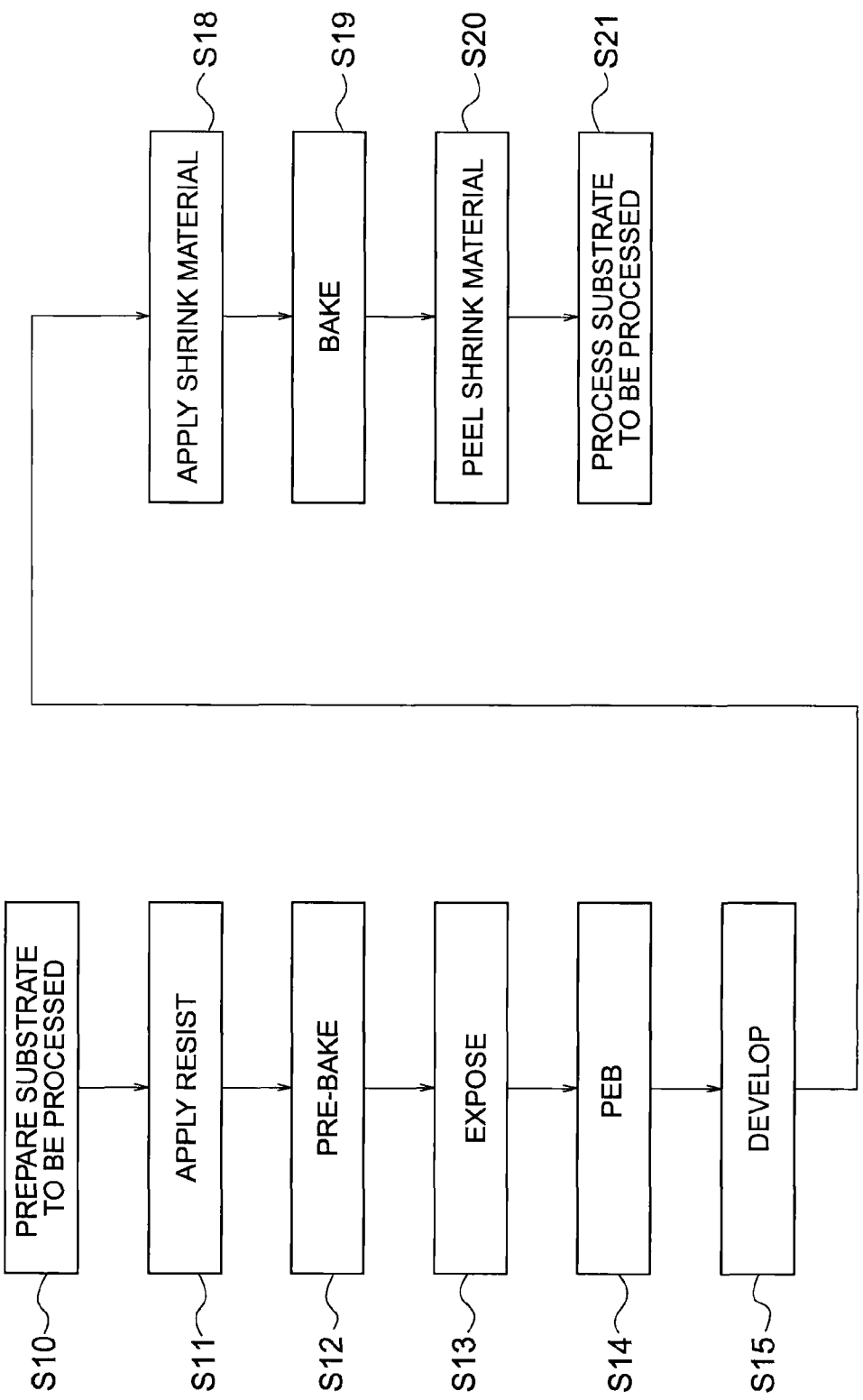
FIG. 8 is a flowchart showing a procedure of processes in a pattern forming method according to a comparative example.
Figure 9:
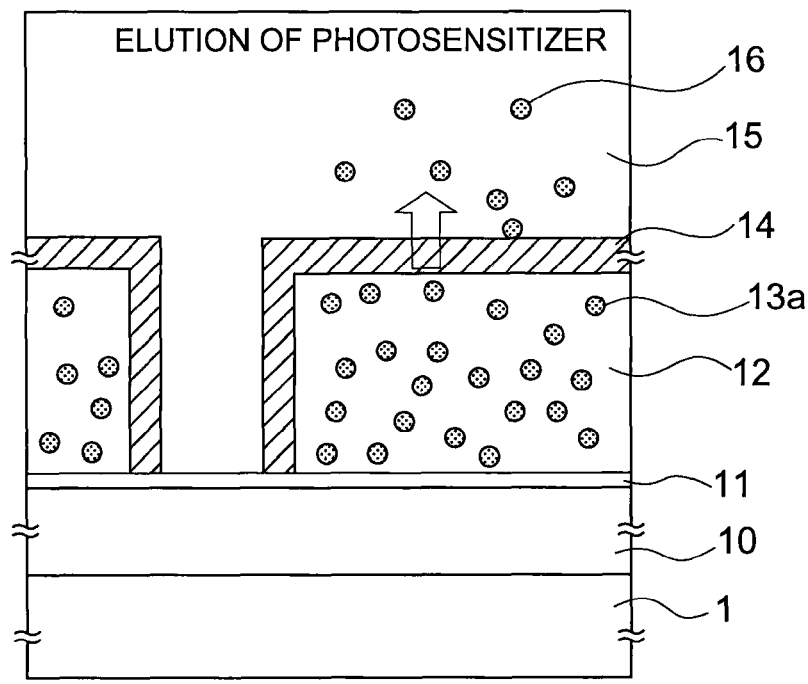
FIG. 9 is a side sectional view showing a cross section of a device in a step of the pattern forming method according to the comparative example.
Figure 10:
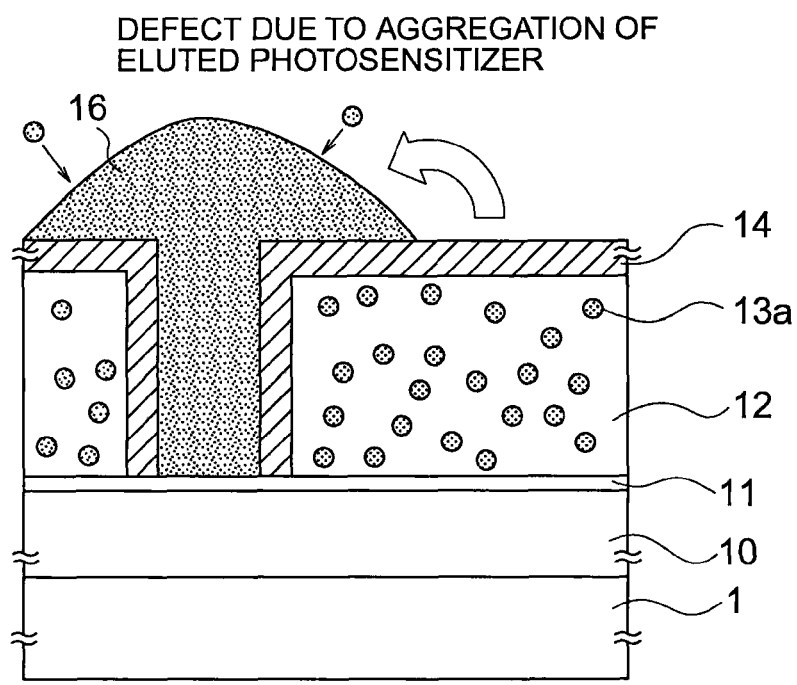
FIG. 10 is a side sectional view showing the cross section of the device in another step of the pattern forming method according to the comparative example.

FIG. 8 shows a procedure of processes in a pattern forming method according to a comparative example. FIGS. 9 and 10 show cross sections of a device in respective steps of the pattern forming method.

Compared with the first embodiment shown in FIG. 1, the pattern forming method according to the comparative example is different in the point that the decomposing process of the photosensitizer in step S16 and the removing process of the acid or the photosensitizer in step S17 are not performed between the developing process in step S15 and the shrink material applying process in step S18.

Specifically, in the comparative example, the shrink process is performed to the resist layer after being developed without performing the heating process for decomposing the photosensitizer and the rinsing process for removing the photosensitizer.

In this case, as shown in FIG. 9, photosensitizer 13a which is not thermally decomposed to acid is eluted from the resist layer 12. This phenomenon does not occur in the first and second embodiments as described with reference to FIG. 4. As a result, in the comparative example, as shown in FIG. 10, photosensitizer 16 is aggregated on a hydrophobic surface of a shrink material 14 to cause defects.

When the hole diameter of the contact hole formed in the comparative example was measured by an electron microscope having a length measuring function, it was shown that the size of the hole diameter was smaller than that of the first embodiment by 10 nm.

Further, when a defect inspection of the semiconductor substrate 1 in the comparative example was performed, defects due to aggregation of the photosensitizer were observed on the resist layer.

On the other hand, according to the first and second embodiments, aggregation of the photosensitizer is prevented on the surface of the shrink material applied on the resist layer, and the occurrences of the defects are largely reduced, without increasing a cost of providing a supply line for a special rinse liquid or the like.

As described above, according to the pattern forming method of the embodiments of the present invention, defects on a resist pattern can be reduced.

The embodiments are only examples of the present invention, and the present invention is not limited thereto. Various modifications can be made within the technical scope of the present invention.

The invention claimed is:

1. A pattern forming method comprising:
   forming a resist layer including photosensitizer whose thermal decomposition temperature is higher than 120° C., on a semiconductor substrate;
   selectively exposing the resist layer;
   developing the selectively exposed resist layer;
   decomposing the photosensitizer in the resist layer by heating the resist layer at a temperature equal to or higher than the thermal decomposition temperature of the photosensitizer and then removing the photosensitizer or acid generated from the decomposed photosensitizer, after the development of the resist layer and before an application of a shrink material on the developed resist layer;
   applying the shrink material on the developed resist layer, after the decomposition of the photosensitizer in the resist layer and the removal of the photosensitizer or the acid generated from the decomposed photosensitizer;
   performing a heating process for the resist layer on which the shrink material is applied; and
   removing a part of the heat-processed shrink material.

2. The method according to claim 1, wherein the resist layer is formed by applying a chemically amplified resist which contains the photosensitizer.

3. The method according to claim 1, wherein,
   in the decomposition of the photosensitizer, the resist layer is exposed using an energy ray.

4. The method according to claim 3, wherein,
   in the decomposition of the photosensitizer, the resist layer is exposed using the energy ray, and is then heat-processed.

5. The method according to claim 1, wherein the surface of the resist layer becomes hydrophilic by the exposure of the resist layer and heat-processing of the resist layer.

6. The method according to claim 1, wherein,
   in the removal of the photosensitizer or the acid, the resist layer is immersed in a solution for extracting acid.

7. The method according to claim 1, wherein,
   in the removal of the photosensitizer or the acid, the resist layer is rinsed with pure water.

8. The method according to claim 1, wherein the shrink material is a water-soluble shrink material of an acid cross linking type.

9. The method according to claim 1, wherein the resist layer and the shrink material are mixed by the heating process for the resist layer on which the shrink material is applied.

10. The method according to claim 9, wherein a cross linking reaction between the resist layer and the shrink material is caused by the mixing.

11. The method according to claim 1, wherein a part of the heat-processed shrink material is removed using a solution for peeling the shrink material.

12. The method according to claim 11, wherein the solution for peeling the shrink material is pure water.

13. The method according to claim 1, wherein,
   in the removal of a part of the heat-processed shrink material, unreacted shrink material is removed.

14. The method according to claim 1, wherein the surface of the resist layer becomes hydrophobic by the application of the shrink material.

15. The method according to claim 1, wherein an antireflection layer is formed between the semiconductor substrate and the resist layer.

16. The method according to claim 1, wherein the semiconductor substrate is processed after the removal of a part of the heat-processed shrink material.

17. The method according to claim 16, wherein a contact hole is formed by the processing of the semiconductor substrate.

* * * * *